US010641402B2

(12) United States Patent
Hiraoka

(10) Patent No.: US 10,641,402 B2
(45) Date of Patent: *May 5, 2020

(54) THREE-WAY VALVE FOR FLOW RATE CONTROL AND TEMPERATURE CONTROL DEVICE USING SAME

(71) Applicant: SHINWA CONTROLS CO., LTD., Kawasaki-shi, Kanagawa (JP)

(72) Inventor: Katsumichi Hiraoka, Kawasaki (JP)

(73) Assignee: SHINWA CONTROLS CO., LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/224,477

(22) Filed: Dec. 18, 2018

(65) Prior Publication Data

US 2019/0195373 A1 Jun. 27, 2019

Related U.S. Application Data

(63) Continuation of application No. 15/515,816, filed as application No. PCT/JP2017/005111 on Feb. 13, 2017, now Pat. No. 10,215,293.

(30) Foreign Application Priority Data

Aug. 26, 2016 (JP) ................. 2016-165604

(51) Int. Cl.
*F16K 11/076* (2006.01)
*F16K 5/12* (2006.01)
*F16K 11/085* (2006.01)

(52) U.S. Cl.
CPC .............. *F16K 11/076* (2013.01); *F16K 5/12* (2013.01); *F16K 11/085* (2013.01); *Y10T 137/86823* (2015.04)

(58) Field of Classification Search
None
See application file for complete search history.

(56) References Cited

U.S. PATENT DOCUMENTS 1,493,133 A * 5/1924 Sykora ................ B01F 15/0264
137/625.47
1,856,380 A * 5/1932 Foster .................. F16K 11/205
137/597

(Continued)

FOREIGN PATENT DOCUMENTS

CN 101135395 A 3/2008
CN 201517636 U 6/2010

(Continued)

OTHER PUBLICATIONS

Extended European Search Report, dated Jun. 17, 2019, for European Application No. 17726103.9.

(Continued)

*Primary Examiner* — John Fox
(74) *Attorney, Agent, or Firm* — Birch, Stewart, Kolasch & Birch, LLP

(57) ABSTRACT

Provided are a three-way valve for flow rate control and a temperature control device using the three-way valve for flow rate control. The three-way valve for flow rate control is capable of controlling a mixture ratio between two kinds of fluids with higher accuracy, as compared to a three-way valve including an inflow port which allows inflow of a high-temperature heat-medium circulating liquid, an inflow port which allows inflow of a low-temperature heat-medium circulating liquid, an outflow port which allows outflow of a constant-temperature heat-medium circulating liquid, and a control valve configured to control the flow rate ratio between the high-temperature heat-medium circulating liquid and the low-temperature heat-medium circulating liquid. The three-way valve for flow rate control includes: a valve (Continued)

main body including a valve seat, the valve seat having a columnar space and having a first valve port, which allows inflow of a first fluid and has a rectangular cross section, and a second valve port, which allows inflow of a second fluid and has a rectangular cross section; a valve body being provided in a freely rotatable manner in the valve seat of the valve main body so as to simultaneously switch the first valve port from an closed state to an opened state and switch the second valve port from an opened state to a closed state, the valve body being formed into a half-cylindrical shape having a predetermined central angle and being formed into a curved-surface shape at each of both end surfaces of the valve body in a circumferential direction; and drive means for driving the valve body to rotate.

7 Claims, 11 Drawing Sheets

(56) References Cited

U.S. PATENT DOCUMENTS

| | | | | |
|---|---|---|---|---|
| 2,225,210 | A | * | 12/1940 | Dillon ................ G05D 23/1346 236/12.2 |
| 2,977,987 | A | * | 4/1961 | Maynard ............. F16K 11/0853 137/625.17 |
| 2,989,990 | A | * | 6/1961 | Bass ..................... F16K 5/0668 137/625.42 |
| 3,189,278 | A | | 6/1965 | Drury |
| 4,146,055 | A | | 3/1979 | Ryder et al. |
| 5,983,937 | A | | 11/1999 | Makihara et al. |
| 6,003,840 | A | | 12/1999 | Campau |
| 6,129,106 | A | * | 10/2000 | Kornelson ........... G05D 11/137 137/101.19 |
| 6,470,913 | B1 | | 10/2002 | Woodworth |
| 2008/0289811 | A1 | | 11/2008 | Kariya |
| 2012/0103448 | A1 | | 5/2012 | Hopf et al. |

FOREIGN PATENT DOCUMENTS

| | | |
|---|---|---|
| CN | 102472401 A | 5/2012 |
| EP | 1355095 A2 | 10/2003 |
| EP | 2 821 679 A1 | 1/2015 |
| FR | 2872240 A1 | 12/2005 |
| JP | 53-99637 U1 | 8/1978 |
| JP | 59-63265 U | 4/1984 |
| JP | 1-176864 A | 7/1989 |
| JP | 9-274521 A | 10/1997 |
| JP | 2004-138126 A | 5/2004 |
| JP | 2008-292026 A | 12/2008 |
| JP | 2008-298176 A | 12/2008 |
| JP | 2016-23704 A | 2/2016 |

OTHER PUBLICATIONS

English translation of the Written Opinion of the International Searching Authority (Forms PCT/ISA/237 and PCT/IB/310) dated Sep. 1, 2017, for International Application No. PCT/JP2017/005111.

International Search Report, issued in PCT/JP2017/005111, dated Mar. 14, 2017.

Notification of Reason for Refusal, issued for Japanese priority application No. 2016-165604, dated Dec. 20, 2016.

* cited by examiner

FIG. 4
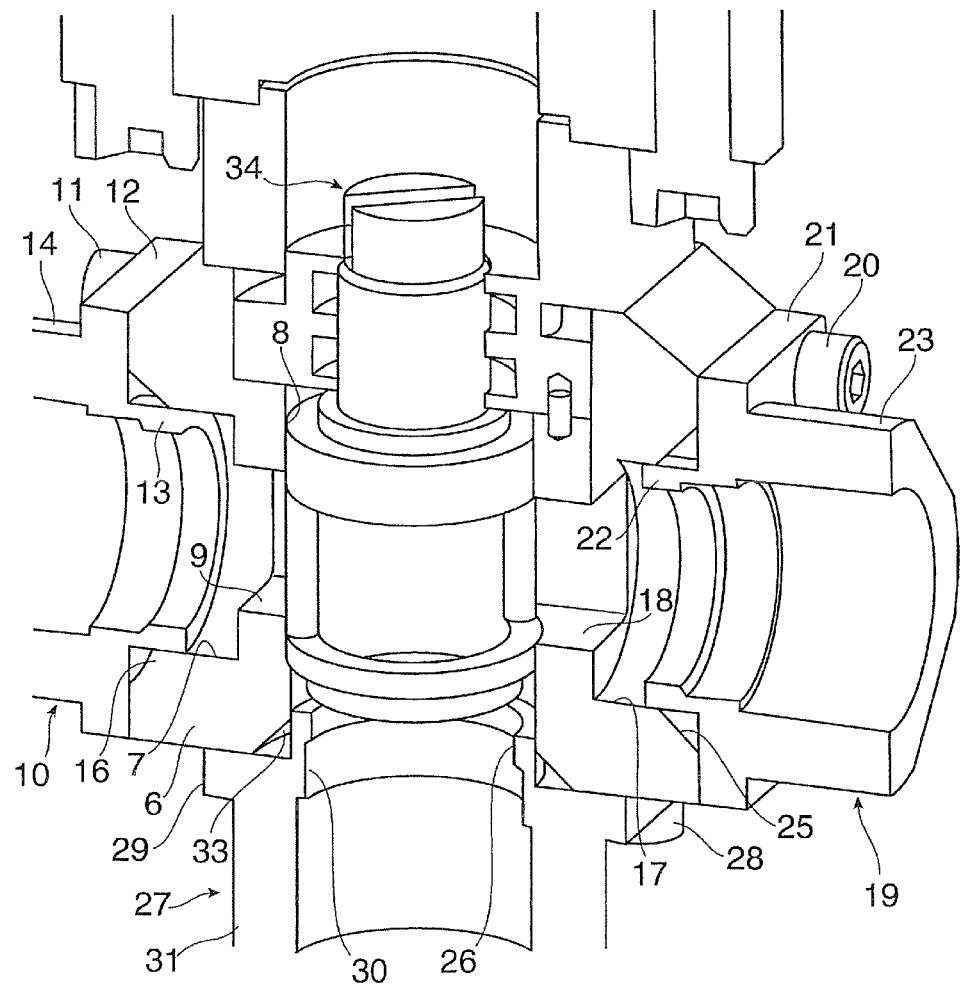
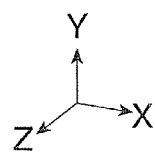

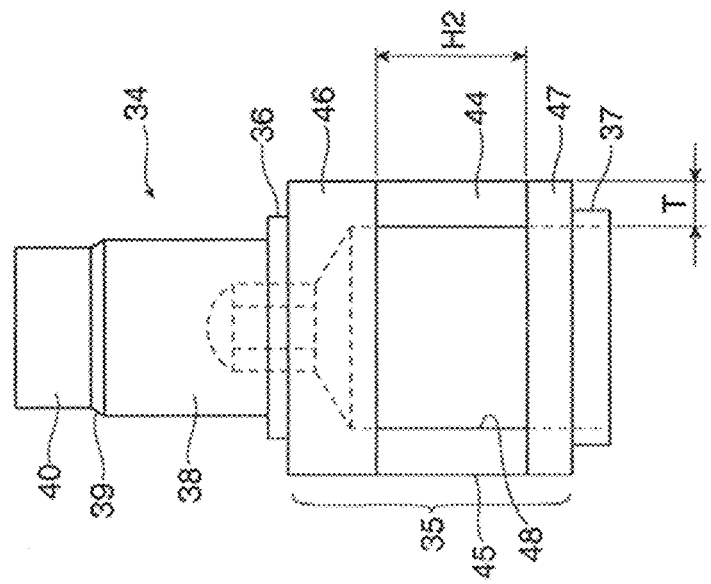
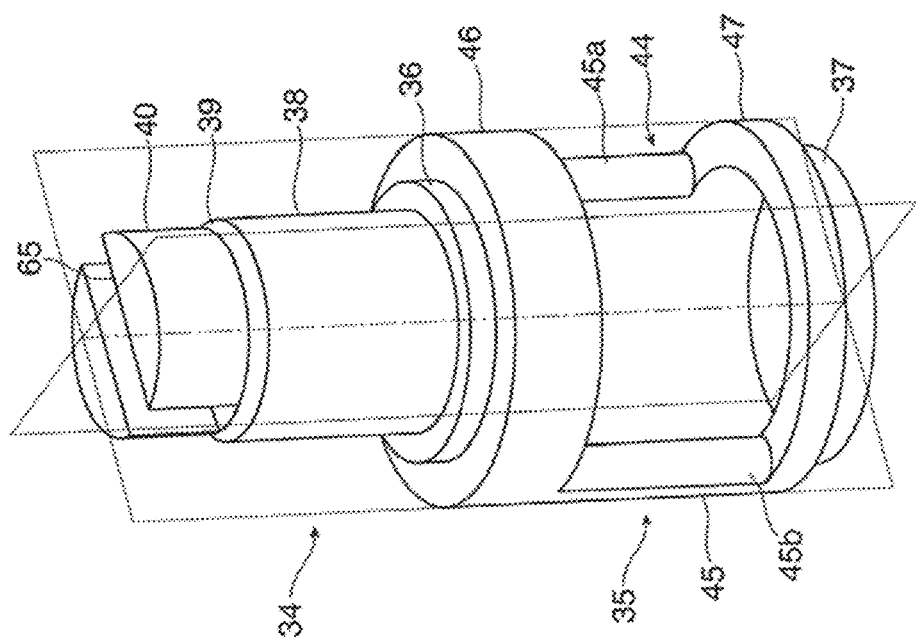

THREE-WAY VALVE FOR FLOW RATE CONTROL AND TEMPERATURE CONTROL DEVICE USING SAME

CROSS-REFERENCE TO RELATED APPLICATIONS

This application is a Continuation of co-pending application Ser. No. 15/515,816 filed on Mar. 30, 2017, which is a National Phase of PCT international Application No. PCT/JP2017/005111 filed on Feb. 13, 2017, which claims priority under 35 U.S.C. § 119(a) to Patent Application No. 2016-165604 filed in Japan on Aug. 26, 2016. All of the above applications are hereby expressly incorporated by reference into the present application.

TECHNICAL FIELD

The present invention relates to a three-way valve for flow rate control and a temperature control device using the same.

BACKGROUND ART

Hitherto, as a technology relating to a three-way valve for flow rote control, there has already been proposed, for example, a three-way valve for flow rate control disclosed in Patent Literature 1.

In Patent Literature 1, provided is a constant-temperature maintaining device configured to control a temperature of an external heat load device through indirect heat exchange with heat-medium circulating liquid. The constant-temperature maintaining device includes a main unit and a sub unit. The main unit includes high-temperature heat-medium circulating-liquid generating means for generating a high-temperature heat-medium circulating liquid adjusted to a predetermined temperature, and low-temperature heat-medium circulating-liquid generating means for generating a low-temperature heat-medium circulating liquid adjusted to a predetermined temperature. The sub unit includes constant-temperature heat-medium circulating-liquid generating means for generating a heat-medium circulating liquid having a predetermined temperature by directly mixing the high-temperature heat-medium, circulating liquid and the low-temperature heat-medium circulating liquid and controlling a flow rate ratio between the high-temperature heat-medium circulating liquid and the low-temperature heat-medium circulating liquid in accordance with a temperature of the external heat load device.

Patent Literature 1 also encompasses the constant-temperature heat-medium circulating-liquid generating means in a mode including a three-way valve, stirring-mixing-feeding means, and three-way-valve control means. The three-way valve includes an inflow port which allows inflow of the high-temperature heat-medium circulating liquid, an inflow port which allows inflow of the low-temperature heat-medium circulating liquid, an outflow port which allows outflow of the constant-temperature heat-medium circulating liquid, and a control valve configured to control the flow rate ratio between the high-temperature heat-medium circulating liquid and the low-temperature heat-medium circulating liquid. The stirring-mixing-feeding means is for stirring and mixing the constant-temperature heat-medium circulating liquid to feed the constant-temperature heat-medium circulating liquid. The three-way-valve control means is for controlling an opening degree of the control valve of the three-way valve in accordance with a temperature of the external heat load device.

CITATION LIST

Patent Literature

[PTL 1] JP 2008-292026 A

SUMMARY OF INVENTION

Technical Problem

The present invention provides a three-way valve for flow rate control, and a temperature control device using the three-way valve for flow rate control. The three-way valve for flow rate control of the present invention is capable of controlling a mixture ratio between two kinds of fluids with higher accuracy, as compared to the three-way valve including the inflow port which allows inflow of the high-temperature heat-medium circulating liquid, the inflow port which allows inflow of the low-temperature heat-medium circulating liquid, the outflow on which allows outflow of the constant-temperature heat-medium circulating liquid, and the control valve configured to central the flow rate ratio between the high-temperature heat-medium circulating liquid and the low-temperature heat-medium circulating liquid.

Solution to Problem

According to the invention of claim 1, provided is a three-way valve for flow rate control, including:
  a valve main body including a valve seat, the valve seat having a columnar space and having a first valve port, which allows inflow of a first fluid and has a rectangular cross section, and a second valve port, which allows inflow of a second fluid and has a rectangular cross section;
  a valve body being provided in a freely rotatable manner in the valve seat of the valve main body so as to simultaneously switch the first valve port from a closed state to an opened state and switch the second valve port from an opened state to a closed state, the valve body being formed into a half-cylindrical shape having a predetermined central angle and being formed into a curved-surface shape at each of both end surfaces of the valve body in a circumferential direction; and
  drive means for driving the valve body to rotate.

According to the invention of claim 2, in a three-way valve for flow rate control as described in claim 1, the valve body has the first valve port and the second valve port which are formed in an axial symmetrical manner with respect to a rotation axis of the valve body as a center axis.

According to the invention of claim 3, in a three-way valve for flow rate control as described in claim 1 or 2, the valve body is formed of a cylindrical body having a half-cylindrical portion, which is formed into a half-cylindrical shape having a predetermined central angle by opening an outer peripheral surface of the cylindrical body, and having one end surface in an axial direction being closed and another end surface being opened.

According to the invention of claim 4, in a three-way valve for flow rate control as described in any one of claims 1 to 3, a cross section of each of both end portions of the valve body in the circumferential direction, which is taken along a direction intersecting the rotation axis, is formed into an arc shape.

According to the invention of claim 5, in a three-way valve for flow rate control as described in any one of claims 1 to 3, a cross section of each of both end portions of the valve body in the circumferential direction, which is taken along a direction intersecting the rotation axis, is formed into a curved shape obtained by smoothly connecting a first curved portion, which is positioned on an outer peripheral surface side of the valve body, and a second curved portion, which is positioned on an inner peripheral side of the valve body and has a curvature radius smaller than that of the first curved portion.

According to the invention of claim 6, provided is a temperature control device, including:

temperature control means having a flow passage for temperature control which allows flow of a fluid for temperature control therethrough, the fluid for temperature control including a lower temperature fluid and a higher temperature fluid adjusted in mixture ratio;

first supply means for supplying the lower temperature fluid adjusted to a first predetermined lower temperature;

second supply means for supplying the higher temperature fluid adjusted to a second predetermined higher temperature; and a three-way valve connected to the first supply means and the second supply means, and configured to adjust the mixture ratio between the lower temperature fluid supplied from the first supply means and the higher temperature fluid supplied from the second supply means and allow the fluid for temperature control to flow through the flow passage for temperature control, in which the three-way valve for flow rate control as described in any one of claims 1 to 5 is used as the three-way valve.

Advantageous Effects of Invention

According to the present invention, a three-way valve for flow rate control and a temperature control device using the three-way valve for flow rate control can be provided. The three-way valve for flow rate control of the present invention is capable of controlling a mixture ratio between two kinds of fluids with higher accuracy, as compared to the three-way valve including the inflow port which allows inflow of the high-temperature heat-medium circulating liquid, the inflow port which allows inflow of the low-temperature heat-medium circulating liquid, the outflow port which allows outflow of the constant-temperature heat-medium circulating liquid, and the control valve configured to control the flow rate ratio between the high-temperature heat-medium circulating liquid and the low-temperature heat-medium circulating liquid.

BRIEF DESCRIPTION OF DRAWINGS

FIG. 4 is a sectional perspective view for illustrating relevant parts of the three-way motor valve as one example of the three-way valve for flow rate control according to the first embodiment of the present invention.

FIGS. 6(a) and 6(b) are configuration views for illustrating a valve shaft.

DESCRIPTION OF EMBODIMENTS

In the following, embodiments of the present it are described with reference to the drawings.

First Embodiment

Figure 1:
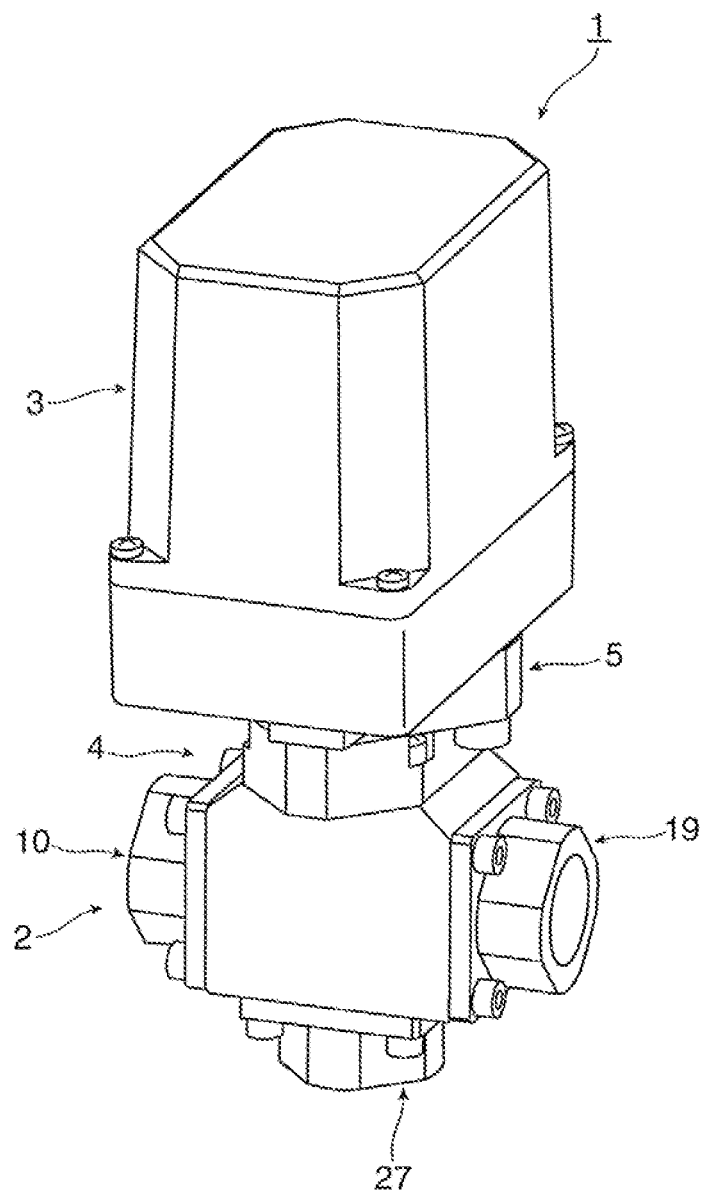
FIG. 1 is a perspective view for illustrating an outer appearance of a three-way motor valve as one example of a three-way valve for flow rate control according to a first embodiment of the present invention.
Figure 2A:
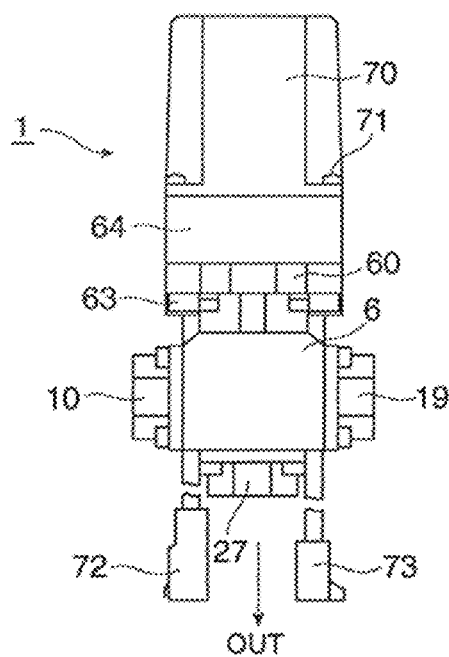
FIG. 2(a) is a front view for illustrating the three-way motor valve as one example of the three-way valve for flow rate control according to the first embodiment of the present invention.
Figure 2B:
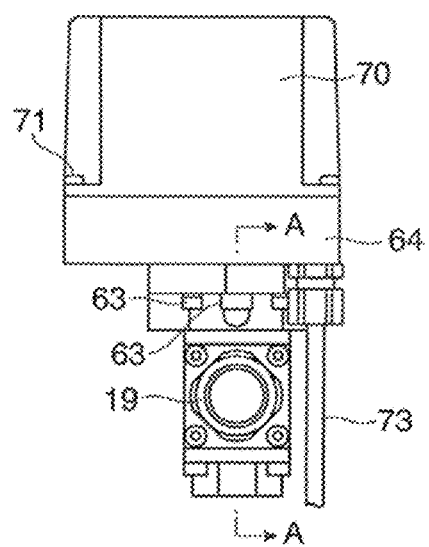
FIG. 2(b) is a right side view of FIG. 2(a).
Figure 2C:
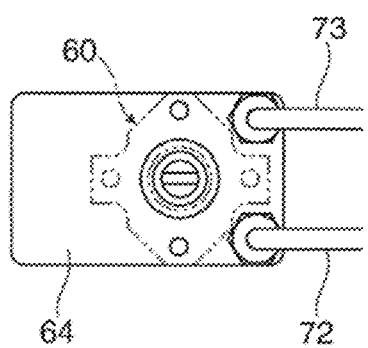
FIG. 2(c) is a bottom view of an actuator.
Figure 3:
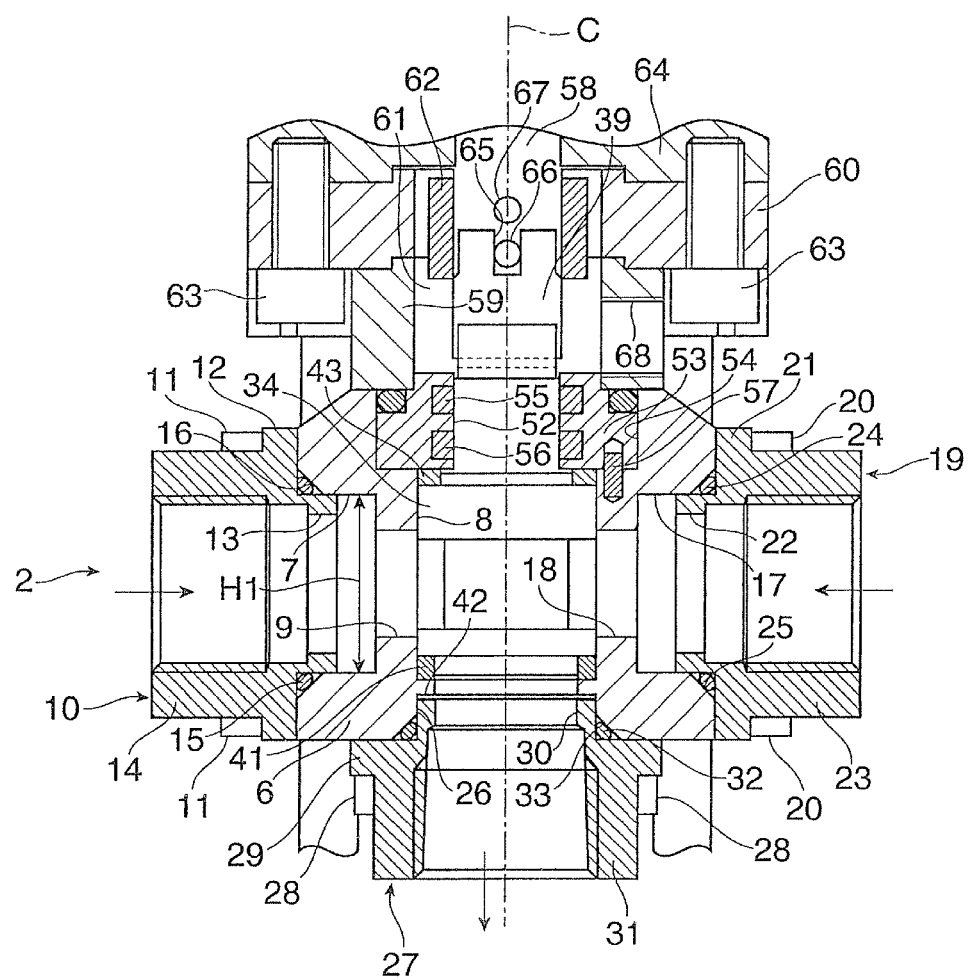
FIG. 3 is a sectional view taken along the line A-A of FIG. 2(b), for illustrating the three-way motor valve as one example of the three-way valve for flow rate control according to the first embodiment of the present invention.

FIG. 1 is a perspective view for illustrating an outer appearance of a three-way motor valve as one example of a three-way valve for flow rate control according to a first embodiment of the present invention. FIG. 2(a) is a front view. FIG. 2(b) is a right side view of FIG. 2(a). FIG. 2(c) is a bottom view of an actuator. FIG. 3 is a sectional view taken along the line A-A of FIG. 2(b). FIG. 4 is a vertical sectional perspective view for illustrating relevant parts of the three-way motor valve.

A three-way motor valve 1 is constructed as a rotary three-way valve. As illustrated in FIG. 1, the three-way motor valve 1 mainly includes a valve portion 2 arranged at a lower portion thereof, an actuator 3 arrange at an upper portion thereof, and a sealing portion 4 and a coupling portion 5, which are arranged between the valve portion 2 and the actuator 3.

As illustrated in FIG. 2 to FIG. 4, the valve portion 2 includes a valve main body 6 obtained by forming metal, for example, SUS, into a substantially rectangular parallelepiped shape. As illustrated in FIG. 3, a first inflow port 7 and a first valve port 9 are opened in one side surface (left side surface in the illustrated example) of the valve main body 6. The first inlet port 7 allows inflow of a lower temperature fluid as a first fluid. The first valve port 9 has a rectangular cross section, and communicates with a valve seat 8 having a columnar space. A first flange member 10 for connecting a pipe (not shown) which allows inflow of the lower temperature fluid is mounted to the left side surface of the valve main body 6 with four hexagon socket head cap screws 11. Similarly to the valve main body 6, the first flange member 10 is formed of metal, for example, SUS. The first flange member 10 has a flange portion 12, an insertion portion 13, and a pipe connecting portion 14. The flange portion 12 has a side surface formed into the same rectangular shape as the side surface of the valve main body 6. The insertion portion 13 is provided to protrude from an inner surface of the flange portion 12 so as to have a thin cylindrical shape. The pipe connecting portion 14 is provided to protrude from an outer surface of the flange portion 12 so as to have a thick and substantially cylindrical shape. A pipe (not shown) is connected to the pipe connecting portion 14. An inner periphery of the pipe connecting portion 14 is set to, for example, Re ½ being a standard for a tapered female thread having where diameter of around 21 mm. An inner peripheral end on an outer side of the first inlet port 7 of the valve main body 6 has a chamfer 16 to allow an O-ring 15 to be mounted between the first inlet port 7 of the valve main body 6 and the flange portion 12 of the first flange member 10.

A second inflow port 17 and a second valve port 18 are opened in another side surface (right side surface in the illustrated example) of the valve main body 6. The second inflow port 17 allows inflow of a higher temperature fluid as a second fluid. The second valve port 1 has a rectangular cross section, and communicates with the valve seat 8 having the columnar space. A second flange member 19 far connecting a pipe (not shown) which allows inflow of the higher temperature fluid is mounted to the right side surface of the valve main body 6 with four hexagon socket head cap screws 20. Similarly to the first flange member 10, the second flange member 19 is formed of metal, for example, SUS. The second flange member 19 has a flange portion 21, an insertion portion 22, and a pipe connecting portion 23. The flange portion 21 has a side surface formed into the same rectangular shape as the side surface of the valve main body 6. The insertion portion 22 is provided to protrude from an inner surface of the flange portion 21 so as to have a thin cylindrical shape. The pipe connecting portion 23 is provided to protrude from an outer surface of the flange portion 21 so as to have a thick and substantially cylindrical shape. A pipe (not shown) is connected to the pipe connecting portion 23. An inner periphery of the pipe connecting portion 23 is set to, for example, Re ½ being a standard for a tapered female thread having a bore diameter of around 21 mm. An inner peripheral end on an outer side of the second inflow port 17 of the valve main body 6 has a chamfer 25 to allow an O-ring 24 to be mounted between the second inflow port 17 of the valve main body 6 and the flange portion 21 of the second flange member 19.

Here, the lower temperature fluid as the first fluid and the higher temperature fluid as the second fluid are fluids to be used for temperature control. A fluid having a relatively lower temperature is referred to as "lower temperature fluid," and a fluid having a relatively higher temperature is referred to as "higher temperature fluid." Thus, the lower temperature fluid and the higher temperature fluid have a relative relationship. The lower temperature fluid is not a fluid having an absolutely low temperature, and the higher temperature fluid is not a fluid having an absolutely high temperature. As the lower temperature fluid and the higher temperature fluid, for example, under air pressure of from 0 MPa to 1 MPa and within a temperature range of from about 0° C. to about 80° C. water (such as pure water) adjusted to a temperature of from about 0° C. to about 30° C. and water (pure water) adjusted to a temperature of from about 50° C. to about 80° C. are suitably used, respectively. Further, as the lower temperature fluid and the higher temperature fluid, for example, within a temperature range of from about −20° C. to about +80° C., there is used a fluid, such a fluorine-based inert liquid, for example, Fluorinert (trademark) and ethylene glycol, which are neither frozen at a temperature of about −20° C. nor vaporized at a temperature of about +80° C.

Further, in a lower end surface of the valve main body 6, an outflow port 26 is opened. The outflow port 26 allows outflow of a fluid for temperature control, which is a mixture of the lower temperature fluid and the higher temperature fluid. A third flange member 27 for connecting a pipe (not shown) which allows outflow of the fluid for temperature control is mounted to the lower end surface of the valve main body 6 with four hexagon socket head cap screws 28. Similarly to the first and second flange members 10 and 19, the third flange member 27 is formed of metal, for example, SUS. The third flange member 27 has a flange portion 29, an insertion portion 30, and a pipe connecting portion 31. The flange portion 29 has a planar surface formed into a rectangular shape, which is smaller than the lower end surface of the valve main body 6. The insertion portion 30 is provided to protrude from an upper end surface of the flange portion 29 so as to have a thin cylindrical shape. The pipe connecting portion 31 is provided to protrude from a lower end surface of the flange portion 29 so as to have a thick and substantially cylindrical shape. A pipe (not shown) is connected to the pipe connecting portion 31. An inner periphery of the pipe connecting portion 31 is set to, for example, Re ½ being a standard for a tapered female thread having a bore diameter of around 21 mm. An inner peripheral end on a lower end of the third inflow port 26 of the valve main body 6 is has a chamfer 33 to allow an O-ring 32 to be mounted between the third outflow port 26 of the valve main body 6 and the flange portion 29 of the third flange member 27.

The valve main body 6 includes, in a center thereof the valve seat 8 having a second valve port 18. The second valve port 18 has a cross section formed into the same rectangular shape as that of the first valve port 9. The valve seat 8 has a space formed into columnar shape corresponding to an outer shape of a valve body to be described later. The valve seat 8 formed into a columnar shape is provided in a state of penetrating an upper end surface of the valve main body 6. As illustrated in FIG. 5, the first valve port 9 and the second valve port 18 provided to the valve main body 6 are arranged in an axial symmetrical manner with respect to a center axis (rotation axis) C of the valve seat 8 formed into a columnar shape. More specifically, the first valve port 9 and the second valve port 18 are arranged so as to be orthogonal with respect to the valve seat formed into a columnar shape. One end edge of the first valve port 9 is opened in a position opposed to another end edge of the second valve port 18 through the center axis C, that is, in a position different by 180°. Further, another end edge of the first valve port 9 is opened in a position opposed to one end edge of the second valve port 18 through the center axis C, that is, in a position different by 180°.

Further, as illustrated in FIG. 4, the first valve port 9 and the second valve port 18 are each formed of an opening having a cross section formed into a rectangular shape, for example, a square shape. A length of one side of the first valve port 9 and the second valve port 18 is set to be smaller than a diameter of the first inlet port 7 and the second inflow port 17. The first valve port 9 and the second valve port 18 have a cross section formed into a rectangular shape inscribed in the first inlet port 7 and the second inflow port 17.

As illustrated in FIG. 6, a valve shaft 34 as one example of the valve body has an outer shape obtained by forming metal, for example, SUS, into a substantially columnar shape. The valve shaft 34 mainly includes a valve body portion 35, upper and lower shaft support parts 36 and 37, a sealing portion 38, and a coupling portion 40, which are integrally provided. The valve body portion 35 sanctions as a valve body. The upper and lower shaft support parts 36 and 37 are provided above and below the valve body portion 35, respectively, and support the valve shaft 34 in a freely rotatable manner. The sealing portion 38 is provided to an upper portion of the upper shaft support portion 36. The coupling portion 40 is provided to an upper portion of the sealing portion 38 through intermediation of a tapered portion 39.

The upper and lower shaft support parts 36 and 37 are formed into a cylindrical shape so as to have an outer diameter smaller than that of the valve body portion 35 and so as to have an equal diameter. A length of the lower shaft support portion 37 in an axial direction is set to be slightly larger than that of the upper shaft support portion 36. As illustrated in FIG. 3, the lower shaft support portion 37 is supported in a freely rotatable manner through intermediation of a bearing 41 by a lower end of the valve seat 8 provided to the valve main body 6. An annular support portion 42 supporting the bearing 41 is provided at a lower portion of the valve seat 8 so as to protrude toward an inner periphery. The bearing 41, the support portion 42, and the insertion portion 30 of the third flange member 27 are set to have an equal inner diameter, and are configured to allow outflow of the fluid fir temperature control, which has passed through an inside of the valve body portion 35, to the connecting portion of the third flange member 27 with little resistance. Meanwhile, a thrust washer 43 is mounted to the upper shaft support portion 36 to reduce a load generated by the valve shaft 34 pressed by a sealing case 53 to be described later.

Further, as illustrated in FIG. 5 and FIG. 6, the valve body portion 35 is formed into a cylindrical shape having an opening 44 formed therein. The opening 44 has a substantially half-cylindrical shape with an opening height H2, which is smaller than an opening height H1 (see FIG. 3) of the first and second valve ports 9 and 18. A valve operating portion 45 having the opening 44 of the valve body portion 35 is formed into a half-cylindrical shape (substantially half-cylindrical shape of a cylindrical portion excluding the opening 44) having a predetermined central angle α (for example about 190°). The valve operating portion 45 is arranged in a freely rotatable manner in the valve seat 8 and held in contact with an inner peripheral surface of the valve seat 8. Accordingly, with the valve body portion 35 positioned above and below the opening 44 included, the valve operating portion 45 simultaneously switches the first valve port 9 from a closed state to au opened state and the second valve port 18 from an opened state to a closed state in a reverse direction. As illustrated in FIG. 6, upper and lower valve shaft parts 46 and 47 arranged above and below the valve operating portion 45 are formed into a cylindrical shape having an outer diameter equal to that of the valve operating portion 45, and are held in contact with the inner peripheral surface of the valve seat 8 in a freely rotatable manner. In an inside over the valve operating portion 45, the upper and lower valve shaft parts 46 and 47, and the sealing portion 38, a space 48 is provide in a state of penetrating the valve shaft 34 toward a lower edge thereof. The space 48 has a columnar shape having a diameter reduced in size toward an upper end thereof.

Further, a cross section of each of both end surfaces 45a and 45b of the valve operating portion 45 in a circumferential direction (rotation direction), which is taken along a direction intersecting (orthogonal to) the center axis C, is formed into a curved-surface shape. More specifically, as illustrated in FIG. 5, the cross section of each of the both end portions 45a and 45b of the valve operating portion 45 in the circumferential direction, which is taken along a direction intersecting the rotation axis C, is formed into an arc shape being convex toward the opening 44. A curvature radius of each of the both end portions 45a and 45b is set to, for example, a half of a thickness T of the valve operating portion 45. As a result, a cross section of each of the both end portions 45a and 45b is a semicircular shape.

Figure 5A:
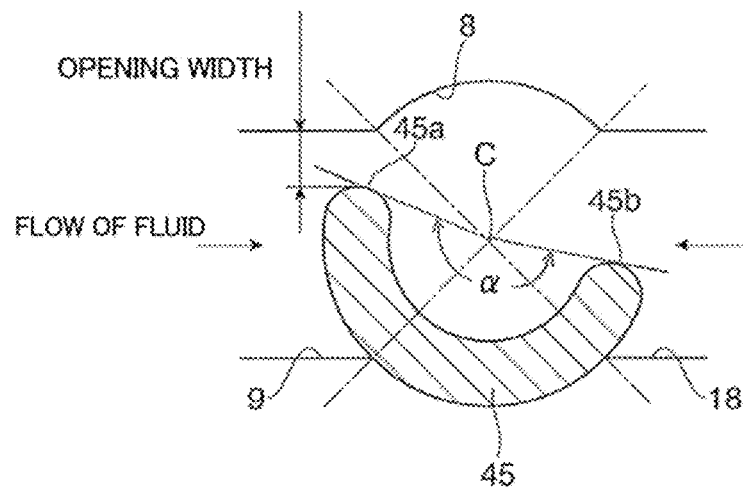
FIGS. 5(a) and 5(b) are sectional configuration views for illustrating a valve actuating portion.
Figure 5B:
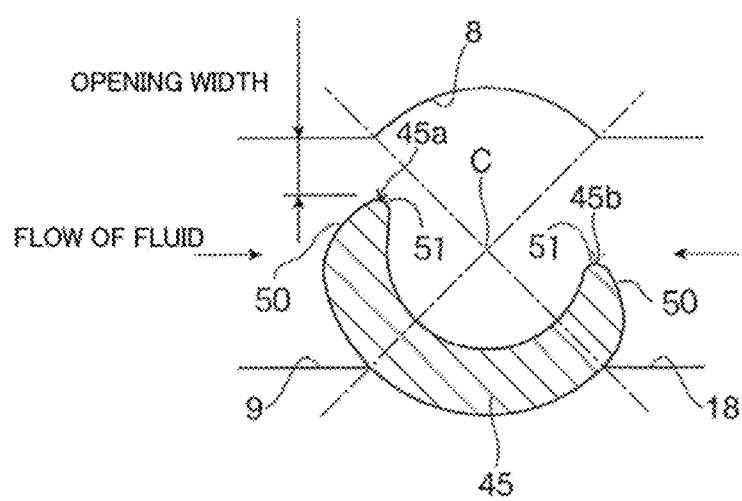

The cross section of each of the both end portions 45a and 45b of the valve operating portion 45 in the circumferential direction, which is taken along a direction intersecting the rotation axis C, is not limited to an arc shape. It is only necessary that each of the both end surfaces 45a and 45b in the circumferential direction (rotation direction) be formed into a curved-surface shape. As illustrated in FIG. 5(b), the cross section of each of the both end portions 45a and 45b of the valve operating portion 45 in the circumferential direction, which is taken along a direction intersecting the rotation axis C, may be formed into a curved shape obtained by smoothly connecting a first curved portion 50, which is positioned on an outer peripheral side, and a second curved portion 51, which is positioned on an inner peripheral side and has a curvature radius smaller than that of the first curved portion 50.

As illustrated in FIG. 5, when the valve shaft 34 is driven to rotate to open and close the first and second valve ports 9 and 18, in flows of the lower temperature fluid and the higher temperature fluid, the both end portions 45a and 45b of the valve operating part 45 in the circumferential direction are moved (rotated) so as to protrude from or retreat to the ends of the first and second valve ports 9 and 18 in the circumferential direction. Accordingly, the first and second valve ports 9 and 18 are switched from the opened state to the closed state, or from the closed state to the opened state. At this moment, each of the both end portions 45a and 45b of the valve operating portion 45 in the circumferential direction have a cross section formed into a curved-surface shape so as to linearly change opening areas of the first and second valve ports 9 and 18 with respect to a rotation angle of the valve shaft 34.

Figure 11A:
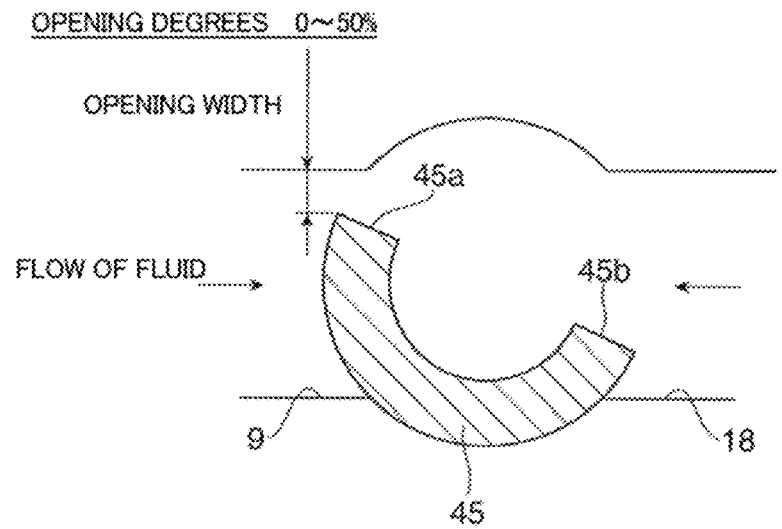
FIGS. 11(a) and 11(b) are sectional configuration views for illustrating another valve actuating portion.
Figure 11B:
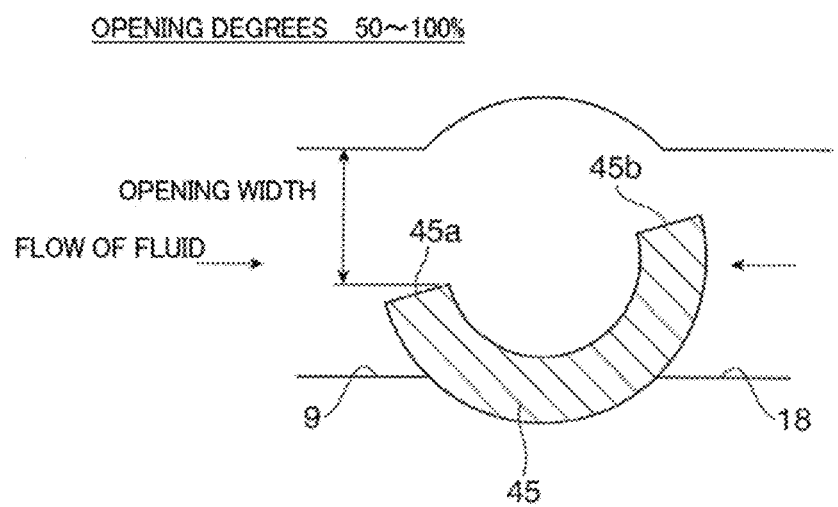

More specifically, as illustrated in FIG. 11, in a case where the both end portions 45a and 45b of the valve operating portion 45 in the circumferential direction are formed into a planar shape along a radial direction, when an opening degree of the valve shaft 34 exceeds 50%, an inner peripheral end of the valve operating portion 45 protrudes more in a direction of causing opening widths of the first and second valve ports 9 and 18 to be reduced as compared to an outer peripheral end of the valve operating portion 45. Accordingly, the opening areas of the first and second valve ports 9 and 18 with respect to the rotation angle of the valve shaft 34 cannot be linearly changed.

Figure 7A:
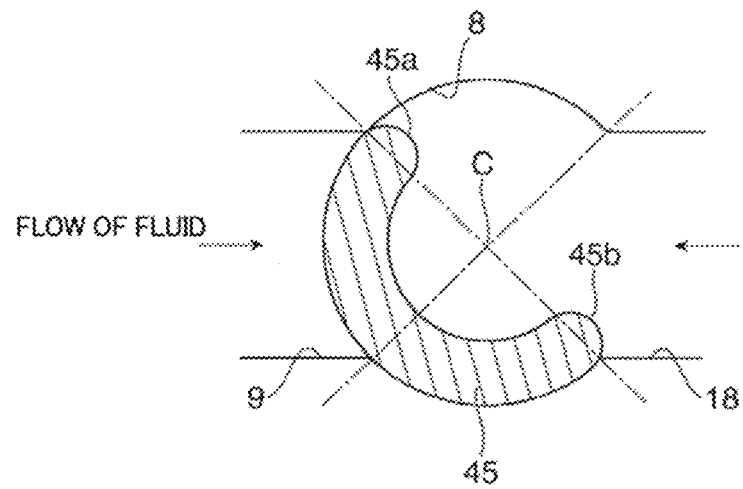
FIGS. 7(a) and 7(b) are sectional configuration views for illustrating the valve actuating portion.
Figure 7B:
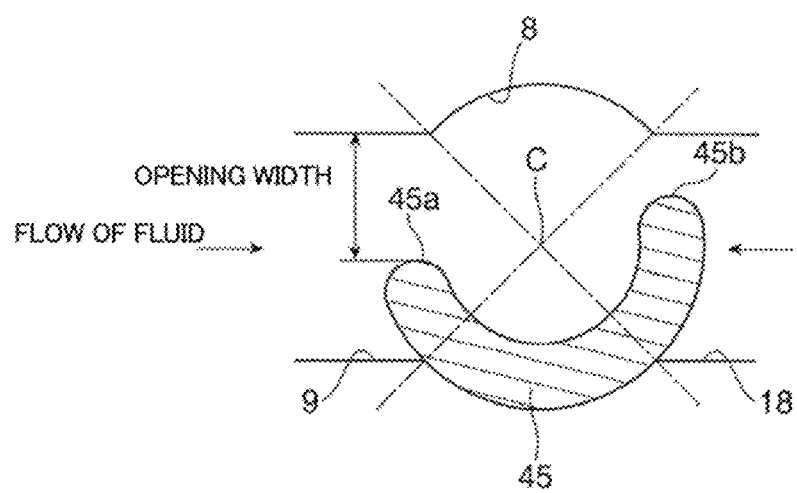

On the contrary, as illustrated in FIG. 7(b), in a case where the cross section of each of the both end portions 45a and 45b of the valve operating portion 45 in the circumferential direction is formed into a curved-surface shape, even when the opening degree of the valve shaft 34 exceeds 50%, the opening areas of the first and second valve ports 9 and 18 with respect to the rotation angle of the valve shaft 34 can be linearly changed.

Thus, the both end portions 45a and 45b of the valve operating portion 45 in the circumferential direction are assumed to bring about effects as blade bodies protruding toward the flows of the fluids flowing into the valve chamber 8 through the first and second valve ports 9 and 18. Therefore, the both end portions 45a and 45b of the valve operating portion 45 in the circumferential direction, which bring about the effects as the blade bodies protruding toward the flows, play an important role in controlling the flow rate of the fluids by limiting or releasing the flows of the fluids. Depending on the flows of the fluids in a periphery of the both end portions 45a and 45b of the valve operating portion 45 in the circumferential direction, which protrude toward the fluids, in a case where the opening areas of the first and second valve ports 9 and 18 are linearly changed by the valve operating portion 45 of the valve shaft 34, the flow rate of the lower temperature fluid and the higher temperature fluid, which are to flow in and to be mixed in the valve chamber 8, is not necessarily changed linearly.

Through various studies that have been conducted by the inventors of the present invention, it has been revealed that the cross section of the both end portions 45a and 45b of the valve operating portion 45 in the circumferential direction plays an important role in linearly controlling the flow rate of the lower temperature fluid and the higher temperature fluid, which are to be mixed in the valve chamber 8. Further, the inventors of the present invention have found out that the flow rate of the lower temperature fluid and the higher temperature fluid can be linearly controlled by forming the cross section of the both end portions 45a and 45b of the valve operating portion 45 in the circumferential direction into a curved-surface shape.

As illustrated in FIG. 3, the sealing portion 4 is configured to seal the valve shaft 34 in a liquid-tight state. The sealing portion 4 has the sealing case 53 obtained by forming metal, for example, SUS, into a cylindrical shape. The sealing case 53 has an insertion through hole 52 through which the valve shaft 34 is inserted. The sealing case 53 is inserted and fixed in a concave portion 54, which is provided to an upper end surface of the valve main body 6 and has a columnar shape, under a state in which a sealing agent is applied to the sealing case 53 or mounted to the valve main body 6 in a sealed state through means such as screw fastening to the concave portion 54 with a male thread portion (not shown) provided to an outer periphery of the sealing case 53. In an inner peripheral surface of the sealing case 53, two annular sealing members 55 and 56, which are formed of O-rings or the like for sealing the valve shall 34, are arranged in a vertical direction. As the sealing members 55 and 56, for example, an O-ring made of hydrogenated acrylonitrile-butadiene rubber (H—NBR), which is excellent in heat resistance, oil resistance, and weather resistance, is used. The sealing case 53 is positioned by a parallel pin 57 and mounted to the concave portion 54 of the valve main body 6.

The coupling portion 5 is arranged between the valve main body 6, in which the sealing portion 4 is provided, and the actuator 3. The coupling portion 5 is configured to connect the valve shaft 34 and a rotation shaft 58, which allows the valve shaft 34 to be integrally rotated, to each other. The coupling portion 5 includes a spacer member 59, an adaptor plate 60, and a coupling member 62. The spacer member 59 is arranged between the sealing portion 4 and the actuator 3. The adaptor plate 60 is fixed to an upper portion of the spacer member 59. The coupling member 62 is accommodated in a space 61 having a columnar shape formed in a state of penetrating an inside of the spacer member 59 and the adaptor plate 60, and connects the valve shaft 34 and the rotation shaft 58 to each other. The spacer member 59 is obtained by forming metal, for example, SUS, into a parallelepiped shape, which has substantially the same planar shape as that of the valve main body 6 and a relatively small height. The spacer member 59 is fixed to both the valve main body 6 and the adaptor plate 60 through means such as screw fastening. Further, as illustrated in FIG. 2(c), the adaptor plate 60 is obtained by forming metal, for example, SUS, into a plate-like shape having a planar polygonal shape. The adaptor plate 60 is mounted to the base 64 of the actuator 3 in a fixed state with hexagon socket head cap screws 63.

As illustrated in FIG. 3, the coupling member 62 is obtained by forming metal, a synthetic resin having heat resistance, or the like into a cylindrical shape. A concave groove 65 is formed so as to penetrate an upper end of the valve shaft 34 in a horizontal direction. Further, the valve shaft 34 is coupled and fixed to the coupling member 62 through the concave groove 65 with a connecting pin 66 provided so as to penetrate the coupling member 62. Meanwhile, a lower end portion of the rotation shaft 58 is coupled and fixed to the coupling member 62 with a connecting pin 67 provided so as to penetrate the coupling member 62. The spacer member 59 has an opening 68 formed in a side surface thereof for detecting leakage of a liquid through the insertion through hole 52 when the liquid leaks from the sealing members 55 and 56. The opening 68 is set to, for example, Re $^1\!/_{16}$ being a standard for a tapered female thread having a bore diameter of around 8 mm.

As illustrated in FIG. 2, the actuator 3 includes the base 64 having a planar surface formed into a rectangular shape. A casing 70 is mounted to an upper portion of the base 64 with screws 71. The easing 70 is constructed as a box body having a rectangular parallelepiped shape, which contains drive means including a stepping motor, an encoder, and the like. The drive means in the actuator 3 only needs to be capable of rotating the rotation shaft 58 in a desired direction with predetermined accuracy based on control signals, and configuration thereof is not limited. The drive means includes a stepping motor, a driving force transmission mechanism, and an angle sensor. The driving force transmission mechanism is configured to transmit a rotational driving force of the stepping motor to the rotation shaft 58 through intermediation of driving force transmission means, for example, a gear. The angle sensor is, for example, an encoder or the like configured to detect a rotation angle of the rotation shaft 58.

In FIG. 2, a reference symbol 72 denotes a stepping motor-side cable, and a reference symbol 73 denotes an angle sensor-side cable. The stepping motor-side cable 72 and the angle sensor-side cable 73 are connected to a control device (not shown) configured to control the three-way motor valve 1.

<Operation of Three-way Motor Valve>

In the three-way motor valve 1 according to the embodiment of the present invention, the flow rate of the lower temperature fluid and the higher temperature fluid is controlled as follows.

As illustrated in FIG. 1, through the first flange member 10 and the second flange member 19, the lower temperature fluid adjusted to a predetermined lower temperature and the higher temperature fluid adjusted to a predetermined higher temperature are supplied through pipes (not shown) to the three-way motor valve 1. As illustrated in FIG. 7(a), for example, in an initial state before start of operation, the three-way motor valve 1 is brought into a state in which the valve operating portion 45 of the valve shaft 34 simultaneously closes (completely closes) the first valve port 9 and opens (completely opens) the second valve port 18.

As illustrated in FIG. 3, in the three-way motor valve 1, when the stepping motor (not shown) provided in the actuator 3 is driven to rotate by a predetermined amount, the rotation shaft 58 is driven to rotate in accordance with a rotation amount of the stepping motor. In the three-way motor valve 1, when the rotation shaft 58 is driven to rotate, the valve shaft 34 coupled and fixed to the rotation shaft 58 is rotated by an angle equivalent to the rotation amount (rotation angle) of the rotation shaft 58. The valve operating portion 45 is rotated in the valve seat 8 along with the rotation, of the valve shaft 34. With this, as illustrated in FIG. 5(a), the one end, portion 45a of the valve operating portion 45 in the circumferential direction gradually opens the first valve port 9. As a result, the lower temperature fluid flowing in from the first housing member 10 through the first inlet port 7 flows into the valve seat 8 through the first valve port 9.

At this moment, as illustrated in FIG. 5(a), the another end portion 45b of the valve operating portion 45 in the circumferential direction opens the second valve port 18. Accordingly, the higher temperature fluid flowing in from the second housing member 19 through the second inflow port 17 flows into the valve seat 8 through the second valve port 18. Then, the higher temperature fluid mixed with the lower temperature fluid flows out from the third housing member 27 via the valve seat 8 through the outflow port 30 of the valve main body 6. A temperature of the higher temperature fluid is adjusted to a constant temperature (for example, 80° C.), which is higher than a temperature of the lower temperature fluid and is determined in advance.

As illustrated in FIG. 7(b), in the three-way motor valve 1, when the valve shaft 34 is driven to rotate, and the one end portion 45a of the valve operating portion 45 in the circumferential direction gradually opens the first valve port 9, the lower temperature fluid flowing in through the first housing member 10 and the higher temperature fluid flowing in through the second housing member 19 are mixed in the valve chamber 8 and the valve shaft 34, with the result that the fluid for temperature control is obtained. The fluid for temperature control is supplied to the outside from the third housing member 27 trough the outflow port 30 of the valve main body 6.

In the three-way motor valve 1, the valve shaft 34 is rotated as the rotation shaft 58 is driven to rotate. The one end portion 45a of the valve operating portion 45 in the circumferential direction gradually opens the first valve port 9, and at the same time, the another end portion 451, of the valve operating portion 45 in the circumferential direction gradually closes the second valve port 18. The lower temperature fluid flowing in through the first valve port 9 and the higher temperature fluid flowing in through the second valve port 18 are mixed in the valve chamber 8 and the valve shaft 34. Then, the resulting fluid for temperature control, which is adjusted in temperature in accordance with a mixture ratio between the lower temperature fluid and the higher temperature fluid, is supplied to the outside through the outflow port 10 of the valve main body 6.

Further, in the three-way motor valve 1, each of the both end portions 45a and 45b of the valve operating portion 45 in the circumferential direction has a cross section formed into a curved-surface shape. Thus, the opening areas of the first and second valve ports 9 and 18 can be linearly changed with respect to the rotation angle of the valve shaft 34. Further, it is conceivable that the lower temperature fluid and the higher temperature fluid regulated in flow rate by the both end portions 45a and 45b of the valve operating portion 45 flow in a form of a nearly laminar flow. Therefore, the mixture ratio (flow rate) between the lower temperature fluid and the higher temperature fluid can be controlled with high accuracy in accordance with the opening areas of the first valve port 9 and the second valve port 18.

Example of Experiment

The inventors of the present invention, experimentally produced the three-way motor valves 1 respectively including the valve shafts 34 as illustrated in FIG. 5(a) and FIG. 5(b), and carried out an experiment to check how a flow coefficient Cv value of each of the lower temperature fluid and the higher temperature fluid changes in accordance with opening degrees of the first valve port 9 and the second valve port 18 along with the rotation of the valve shaft 34.

The flow coefficient Cv value of each of the lower temperature fluid, the higher temperature fluid, and the fluid or temperature control, which is a mixture of the lower temperature fluid and the higher temperature fluid, were measured by moving one flow rate sensor having high detection accuracy to each of the first valve port 9, the second valve port 18, and the outflow port 30 individually at the timing when the rotation angle of the valve shaft 34 was changed.

Figure 8:
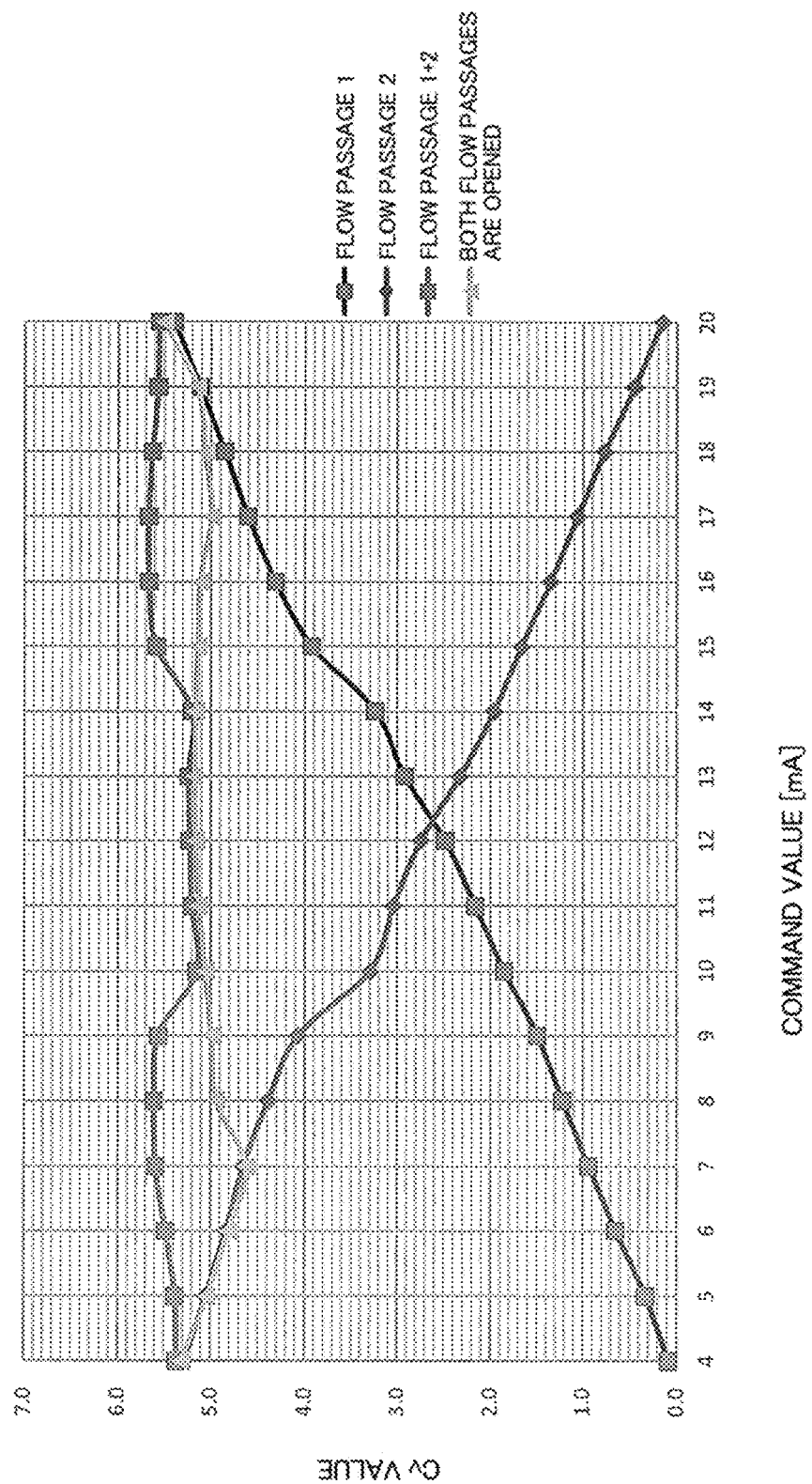
FIG. 8 is a graph for showing characteristics of the three-way motor valve as one example of the three-way valve for flow rate control according to the first embodiment of the present invention.
Figure 9:
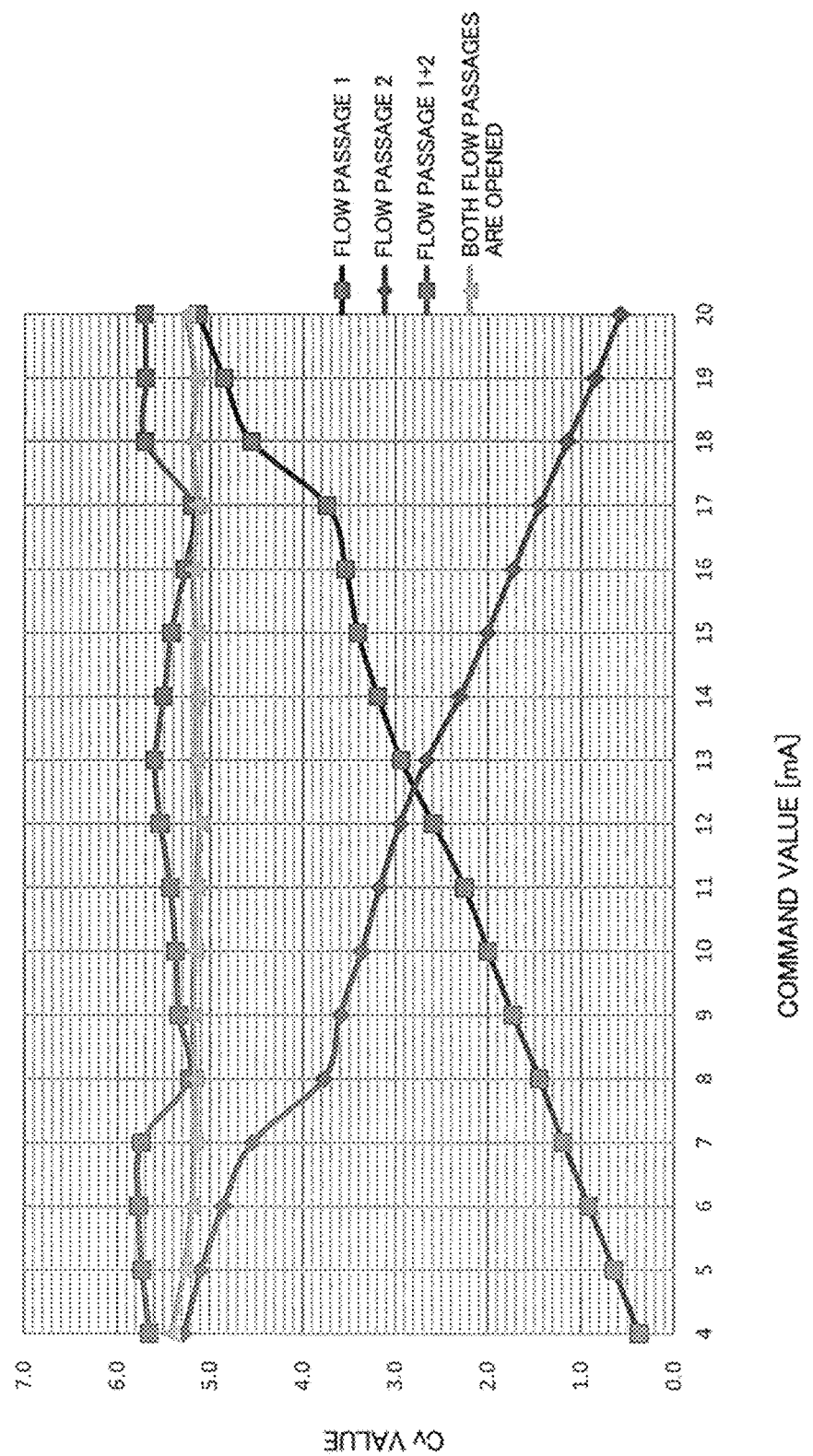
FIG. 9 is a graph for showing the characteristics of the three-way motor valve as one example of the three-way valve for flow rate control according to the first embodiment of the present invention.

FIG. 8 and FIG. 9 are graphs for showing results of the above-mentioned examples. FIG. 8 corresponds to the valve shaft of FIG. 5(a), and FIG. 9 corresponds to the valve shaft of FIG. 5(b).

As a result, as is apparent from the graphs shown in FIG. 8 and FIG. 9, the flow coefficient Cv value of the lower temperature fluid was linearly increased along with the rotation angle of the valve shaft 34. Simultaneously, the flow coefficient Cv value of the higher temperature fluid was linearly reduced. It has been revealed that the mixture ratio (flow rate) between the lower temperature fluid and the higher temperature fluid can be controlled with high accuracy. Further, as is apparent from the graphs shown in FIG. 8 and FIG. 9, in a region where the opening degree of the valve shaft 34 was 50% or more, the valve shafts of FIG. 5(a) and FIG. 5(b) each had a region where the flow coefficient Cy value was slightly deviated from the linear line. The reason for this is assumed to be derived from the curved-surface shape of each of the both end portions 45a and 45b because, in the case of the valve shaft of FIG. 5(b), the region where the flow coefficient Cv value was slightly deviated from the linear line was shifted to the region where the opening degree of the valve shaft 34 was higher as compared to the case of the valve shaft of FIG. 5(a).

In the graph shown in FIG. 9, even when the valve shaft 34 was rotated to a completely opened position, it can be seen that the flow coefficient Cv value of one fluid did not become completely zero. This is probably because the curvature radius of the outer peripheral side of each of the both end portions 45a and 45b of the valve operating portion 45 in the circumferential direction was set larger. However, in consideration that the three-way motor valve 1 is used for temperature control, even when the flow coefficient Cv value of the one fluid does not become completely zero in the case where the valve shaft 34 is rotated to the completely opened position, there arises no problem in actual use when other open/close valves are used in combination.

Example 1

Figure 10:
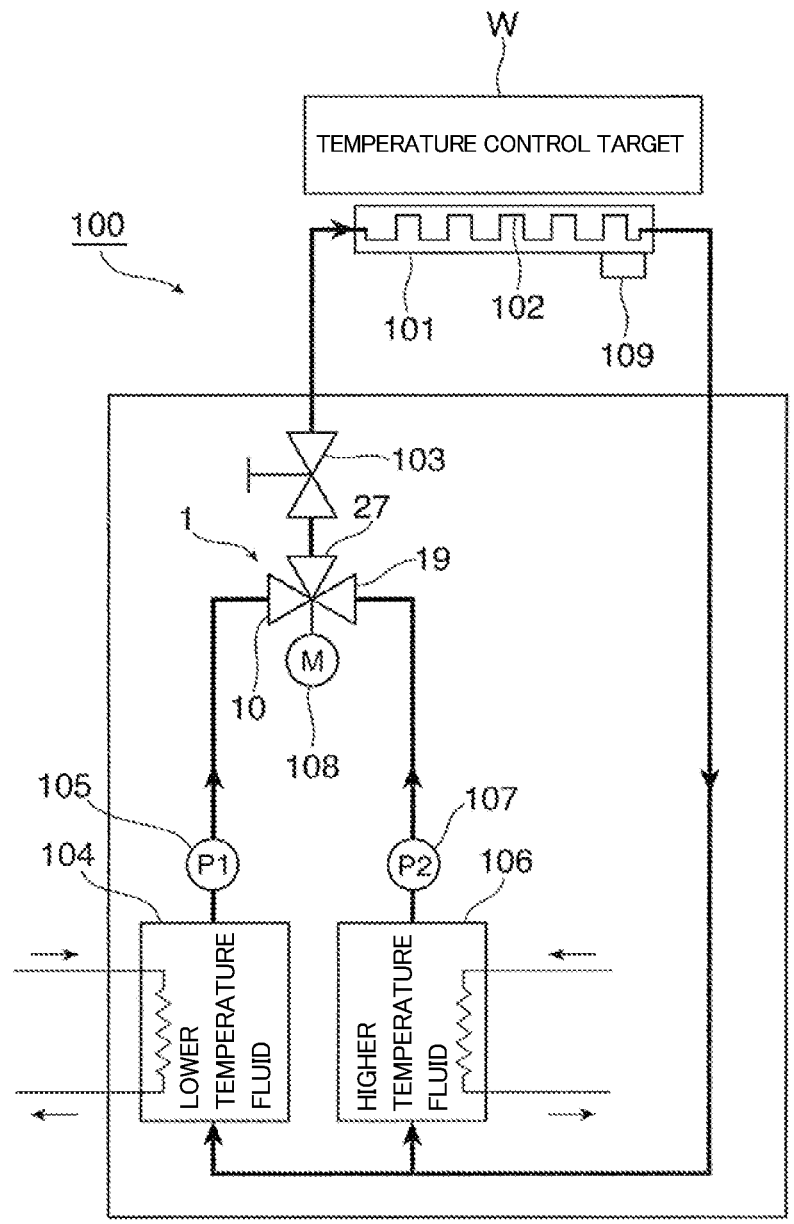
FIG. 10 is a schematic diagram for illustrating a constant-temperature maintaining device (chiller device) to which the three-way motor valve as one example of the three-way valve for flow rate control according to the first embodiment of the present invention is applied.

FIG. 10 is a schematic diagram for illustrating a constant-temperature maintaining device (chiller device) to which the three-way motor valve as one example of the three-way valve for flow rate control according to the first embodiment of the present invention is applied.

A chiller device 100 is, for example, used for a semiconductor manufacturing apparatus involving plasma etching, and configured to maintain a temperature of a semiconductor wafer or the like as one example of a temperature control target W to a constant temperature. The temperature control target W, for example, a semiconductor wafer, may rise in temperature along with generation or discharge of plasma or the like after being subjected to plasma etching or the like.

The chiller device 100 includes a temperature control portion 101 constructed to have a table-like shape as one example of the temperature control means arranged so as to be held in contact with the temperature control target W. The temperature control portion 101 has a flow passage 102 for temperature control therein. The fluid for temperature control, which includes the lower temperature fluid and the higher temperature fluid having been adjusted in mixture ratio, flows through the flow passage 102 for temperature control.

The three-way motor valve 1 is connects d to the flow passage 102 for temperature control in the temperature control portion 101 through an open/close valve 103. A constant-temperature reservoir 104 for lower temperature is connected to the first flange portion 10 of the three-way motor valve 1. The constant-temperature reservoir 104 for lower temperature stores the low temperature fluid adjusted to a predetermined lower temperature. The lower temperature fluid is supplied to the three-way motor valve 1 from the constant-temperature reservoir 104 for lower temperature by a first pump 105. Further, a constant-temperature reservoir 106 for higher temperature is connected to the second flange portion 19 of the three-way motor valve 1. The constant-temperature reservoir 106 for higher temperature stores the high temperature fluid adjusted to a predetermined higher temperature. The higher temperature fluid is supplied to the three-way motor valve 1 from the constant-temperature reservoir 106 for higher temperature by a second pump 107. The third flange member 27 of the three-way motor valve 1 is connected to the flow passage 102 for temperature control in the temperature control portion 101 through the open/close valve 103.

Further, on an outflow side of the flow passage 102 for temperature control in the temperature control portion 101, a pipe for returning is provided. The pipe for returning is connected to the constant-temperature reservoir 104 for lower temperature and the constant-temperature reservoir 106 for higher temperature.

The three-way motor valve 1 includes a stepping motor 108 configured to drive the valve shaft 34 to rotate. Further, a temperature sensor 109 configured to detect a temperature of the temperature control portion 101 is provided to the temperature control portion 101. The temperature sensor 109 is connected to a control device (not shown), and the control device is configured to control a drive of the stepping motor 108 of the three-way motor valve 1.

As illustrated in FIG. 10, in the chiller device 100, a temperature of the temperature control target W is detected by the temperature sensor 109. Based on a detection result obtained by the temperature sensor 109, the rotation of the stepping motor 108 of the three-way motor valve 1 is controlled by the control device. Accordingly, the temperature control target W is controlled to a temperature equal to a predetermined temperature.

When the valve shaft 34 is driven to rotate by the stepping motor 108, the three-way motor valve 1 controls the mixture ratio between the lower temperature fluid, which is supplied from the constant-temperature reservoir 104 for lower temperature by the first pump 105, and the higher temperature fluid, which is supplied from the constant-temperature reservoir 106 for higher temperature by the second pump 107, to control a temperature of the fluid for temperature control, which is a mixture of the lower temperature fluid and the higher temperature fluid to be supplied to the flow passage 102 for temperature control in the temperature control portion 101 from the three-way motor valve 1 through the open/close valve 103.

At this moment, as illustrated in FIG. 8, the three-way motor valve 1 is capable of controlling the mixture ratio between the lower temperature fluid and the higher temperature fluid in accordance with the rotation angle of the valve shaft 34 with high accuracy, thereby being capable of finely adjusting a temperature of the fluid for temperature control. Thus, the chiller device 100 using the three-way motor valve 1 according to the embodiment of the present invention is capable of controlling a temperature of the temperature control target W, which is held in contact with the temperature control portion 101, to a desired temperature, by allowing the fluid for temperature control, which is controlled in mixture ratio between the lower temperature fluid and the higher temperature fluid and adjusted in temperature to a predetermined temperature, to flow through the flow passage 102 for temperature control in the temperature control portion 101.

INDUSTRIAL APPLICABILITY

The three-way valve for flow rate control is capable of controlling the mixture ratio between the two kinds of fluids with high accuracy. Through use of the three-way valve for flow rate control in the temperature control device, a temperature of the temperature control target can be controlled with high accuracy.

REFERENCE SIGN LIST 1 three-way motor valve
2 valve portion
3 actuator
4 sealing portion
5 coupling portion
6 valve main body
7 first inflow port
8 valve seat
9 first valve port
10 first flange member
11 hexagon socket head cap screw
12 flange portion
13 insertion portion
14 pipe connecting portion
15 O-ring
16 chamfer
17 second inflow port
18 second valve port
19 second flange member
20 hexagon socket head cap screw
21 flange portion
22 insertion portion
23 pipe connecting portion
34 valve shaft
35 valve body portion
45 valve operating portion
45a, 45b end portion

The invention claimed is:

1. A three-way valve for flow rate control, comprising:
   a valve main body including a valve seat, the valve seat having a columnar space and having a first valve port defining a rectangular tubular shaped space having a rectangular cross section, which allows inflow of a first fluid, and a second valve port defining a rectangular tubular shaped space having a rectangular cross section, which allows inflow of a second fluid;
   a valve body being provided in a freely rotatable manner in the valve seat of the valve main body so as to simultaneously switch the first valve port from a closed state to an opened state and switch the second valve port from an opened state to a closed state, the valve body being formed into a half-cylindrical shape having a predetermined central angle and being formed into a planar shape at each of both end surfaces of the valve body in a circumferential direction; and
   a drive configured to drive the valve body to rotate.

2. A three-way valve for flow rate control according to claim 1, wherein the valve body has the first valve port and the second valve port which are formed in an axial symmetrical manner with respect to a rotation axis of the valve body as a center axis.

3. A three-way valve for flow rate control according to claim 2, wherein the valve body is formed of a cylindrical body having a half-cylindrical portion, which is formed into a half-cylindrical shape having a predetermined central angle by opening an outer peripheral surface of a cylindrical body, and having one end surface thereof in an axial direction being closed and another end surface being opened.

4. A three-way valve for flow rate control according to claim 1, wherein the valve body is formed of a cylindrical body having a half-cylindrical portion, which is formed into a half-cylindrical shape having a predetermined central angle by opening an outer peripheral surface of a cylindrical body, and having one end surface thereof in an axial direction being closed and another end surface being opened.

5. A three-way valve for flow rate control according to claim 1, wherein a cross section of each of both end portions of the valve body in the circumferential direction, which is taken along a direction intersecting the rotation axis, is formed into an arc shape.

6. A three-way valve for flow rate control according to claim 1, wherein a cross section of each of both end portions of the valve body in the circumferential direction, which is taken along a direction intersecting the rotation axis, is formed into a curved shape obtained by smoothly connecting a first curved portion, which is positioned on an outer peripheral surface side of the valve body, and a second curved portion, which is positioned on an inner peripheral side of the valve body and has a curvature radius smaller than that of the first curved portion.

7. A temperature control device, comprising:
   temperature controller having a flow passage for temperature control which allows flow of a fluid for temperature control therethrough, the fluid for temperature control including a lower temperature fluid and a higher temperature fluid adjusted in mixture ratio;
   first supply means for supplying the lower temperature fluid adjusted to a first predetermined lower temperature;
   second supply means for supplying the higher temperature fluid adjusted to a second predetermined higher temperature; and
   a three-way valve connected to the first supply means and the second supply means, and configured to adjust the mixture ratio between the lower temperature fluid supplied from the first supply means and the higher temperature fluid supplied from the second supply means and allow the fluid for temperature control to flow through the flow passage for temperature control,
   wherein the three-way valve for flow rate control of claim 1 is used as the three-way valve.

* * * * *